United States Patent

Garcia

(10) Patent No.: US 8,733,535 B2
(45) Date of Patent: May 27, 2014

(54) SHALLOW ANGLE VERTICAL ROTARY LOADER FOR ELECTRONIC DEVICE TESTING

(75) Inventor: Douglas J. Garcia, Beaverton, OR (US)

(73) Assignee: Electro Scientific Industries, Inc., Portland, OR (US)

( * ) Notice: Subject to any disclaimer, the term of this patent is extended or adjusted under 35 U.S.C. 154(b) by 215 days.

(21) Appl. No.: 13/163,504

(22) Filed: Jun. 17, 2011

(65) Prior Publication Data

US 2012/0318639 A1 Dec. 20, 2012

(51) Int. Cl.
*B65G 29/00* (2006.01)
*B65B 35/34* (2006.01)

(52) U.S. Cl.
USPC ............ 198/397.02; 198/397.01; 198/397.03; 198/396

(58) Field of Classification Search
USPC .................. 198/397.01, 397.02, 397.03, 396
See application file for complete search history.

(56) References Cited

U.S. PATENT DOCUMENTS

| | | | | |
|---|---|---|---|---|
| 3,710,920 A | * | 1/1973 | Sterling | 198/380 |
| 4,705,156 A | * | 11/1987 | Boling | 198/392 |
| 4,825,995 A | * | 5/1989 | Nalbach | 198/396 |
| 5,775,478 A | * | 7/1998 | Shinjo | 198/389 |
| 5,842,579 A | | 12/1998 | Garcia et al. | |
| 5,984,079 A | | 11/1999 | Garcia | |
| 6,204,464 B1 | | 3/2001 | Garcia et al. | |
| 7,527,140 B2 | * | 5/2009 | Kodera | 198/396 |

FOREIGN PATENT DOCUMENTS

| | | |
|---|---|---|
| JP | 2011-000564 A | 1/2011 |
| KR | 10-2003-0010442 A | 2/2003 |

* cited by examiner

*Primary Examiner* — Leslie A Nicholson, III
(74) *Attorney, Agent, or Firm* — Young Basile Hanlon & MacFarlane P.C.

(57) ABSTRACT

A rotary loader taught herein comprises a rotatable load plate including a plurality of component pockets arranged about a rotational axis of the load plate, the load plate inclined with respect to a horizontal surface at an angle of inclination of less than 50 degrees and a load wall arranged about a lower portion of the load plate adjacent certain ones of the plurality of component pockets and extending above a height of the load plate. The load wall includes a retention surface extending in a direction parallel to an outer peripheral edge of the load plate and a loading surface inclined with respect a line perpendicular to a top surface of the load plate in a direction away from the retention surface at an angle of inclination of less than 45 degrees.

14 Claims, 3 Drawing Sheets

SHALLOW ANGLE VERTICAL ROTARY LOADER FOR ELECTRONIC DEVICE TESTING

FIELD OF THE INVENTION

The disclosure relates to the field of electronic device testing and, more particularly, to a rotary loader for use in testing miniature electronic devices.

BACKGROUND

Many electronic devices are tested for electrical and optical properties during manufacturing by automated test systems. Typical automatic test systems use precision electrical or optical test equipment to find values associated with electrical and optical properties of a device and either accept, reject or sort it into an output category depending upon the measured values. For miniature devices, automatic test systems are often designed to handle bulk loads, where the manufacturing process creates a volume of devices that have substantially identical mechanical characteristics such as size and shape but differ in electrical or optical characteristics. It is common practice to build a volume of devices with electrical and optical properties that generally fall within a range and rely on testing to sort the devices into commercially useful groups with similar characteristics.

These devices are often supplied to the test equipment as containers filled with devices. Typically the test equipment must extract a single device from the bulk load of devices, orient the device and fixture it so the test equipment can perform the desired tests.

SUMMARY OF THE INVENTION

Embodiments of a rotary loader are taught herein that can be used for both vertical and flat component loading with reduced changeover time. One embodiment comprises a circular, rotatable load plate including a plurality of component pockets arranged about a rotational axis of the load plate. The load plate is inclined with respect to a horizontal surface at an angle of inclination of less than 50 degrees. This rotary loader also includes a load wall arranged about a lower portion of the load plate adjacent certain ones of the plurality of component pockets and extending above a height of the load plate. The load wall includes a retention surface extending in a direction parallel to an outer peripheral edge of the load plate and a loading surface inclined with respect a line perpendicular to a top surface of the load plate in a direction away from the retention surface at an angle of inclination of less than 45 degrees.

Details of and variations in this embodiment and other embodiments of the invention are described in detail hereinafter.

BRIEF DESCRIPTION OF THE DRAWINGS

The description herein makes reference to the accompanying drawings wherein like reference numerals refer to like parts throughout the several views, and wherein.

DETAILED DESCRIPTION

While automated test systems for electronic components or devices are known, existing systems are not generally useful with respect to LEDs. Loading, testing and sorting LEDs is particularly challenging because the wide variance in manufacturing tolerances and the sensitivity of the human eye to small variations in light output combine to require that LEDs be tested and sorted into a large number of output groups. Moreover, the packages for components to be tested often vary in both size and the arrangement of contacts. This is particular true for LEDs since there is little standardization across manufacturers, and often multiple active elements are housed together.

Figure 1:
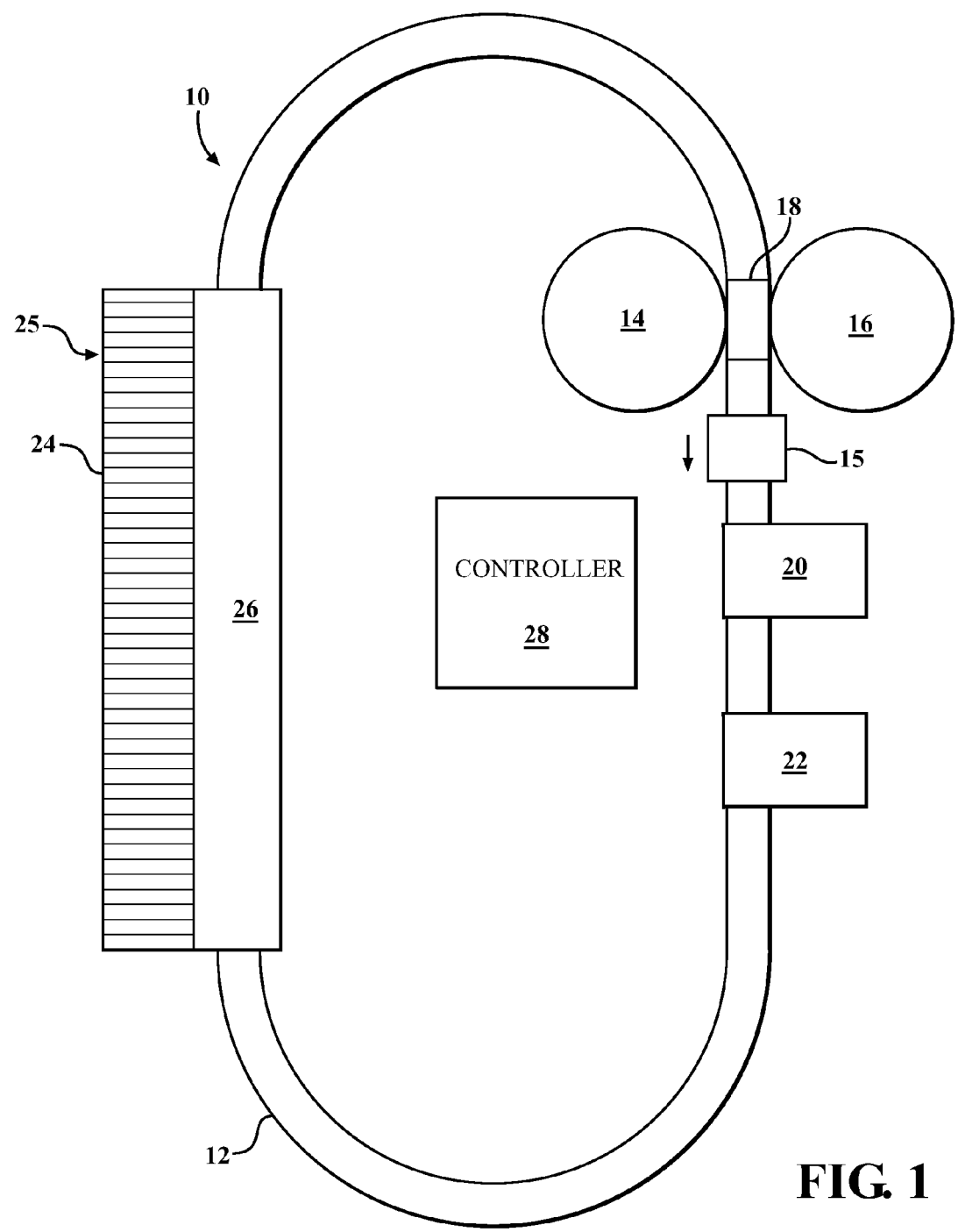
FIG. 1 is a top down view showing one embodiment of an automated test system.

As described starting with respect to FIG. 1, embodiments of an automated test system 10 for loading, testing and sorting of miniature electronic devices 11 (FIG. 3) taught herein can include a rotary loader that successfully loads devices 11 of varying sizes and configurations at a high rate. This is particularly desirable for devices 11 such as light emitting diodes (LEDs) that generally have varying shapes dependent upon manufacturer and size and often have multiple sets of contacts.

Test system 10 includes a conveyor 12 and one or more loading stations, such as a first device loader 14 and a second optional device loader 16 that load electronic devices 11 onto carriers 15 at a transfer station 18. Test system 10 further includes one or more test stations, such as a first test station 20 and a second test station 22 as discussed in more detail hereinafter. Carriers 15 are aligned with respect to first and second test stations 20, 22 for testing. After testing, an unloading station 25 is provided to unload devices 11. A controller 28 is in electrical communication, either wired or wireless, with conveyor 12, first and second device loaders 14, 16, first and second test stations 20, 22, and unloading station 25 to sense and control the operations of each.

Controller 28 has a conventional structure and may include a processor, memory, storage media, communications devices, and input and output devices. For example, controller 28 can be a standard microcontroller that includes a central processing unit (CPU), random access memory (RAM), read only memory (ROM) and input/output ports receiving input signals and sending output signals needed to control the system and to perform certain process steps as described herein. The functions described herein are generally programming instructions stored in memory and are performed by the logic of the CPU. Of course, the controller that performs the functions described herein could be a microprocessor using external memory or could comprise a combination of such a microprocessor or microcontroller combined with other integrated logic circuits. Controller 28 is generally incorporated into or works with a personal computer with a screen and input devices, such as keyboards, for inputting commands for process control and for monitoring the process control.

As mentioned, in order to test electronic devices 11 at one or both of first test station 20 and second test station 22, electronic devices 11 are loaded onto carriers 15 from first and optionally second device loaders 14, 16. One embodiment of a device loader 14 is shown by example in FIGS. 2 and 3. Device loader 16 would be similarly structured except that its load plate optionally rotates in an opposite direction from that of device loader 14.

Figure 2:
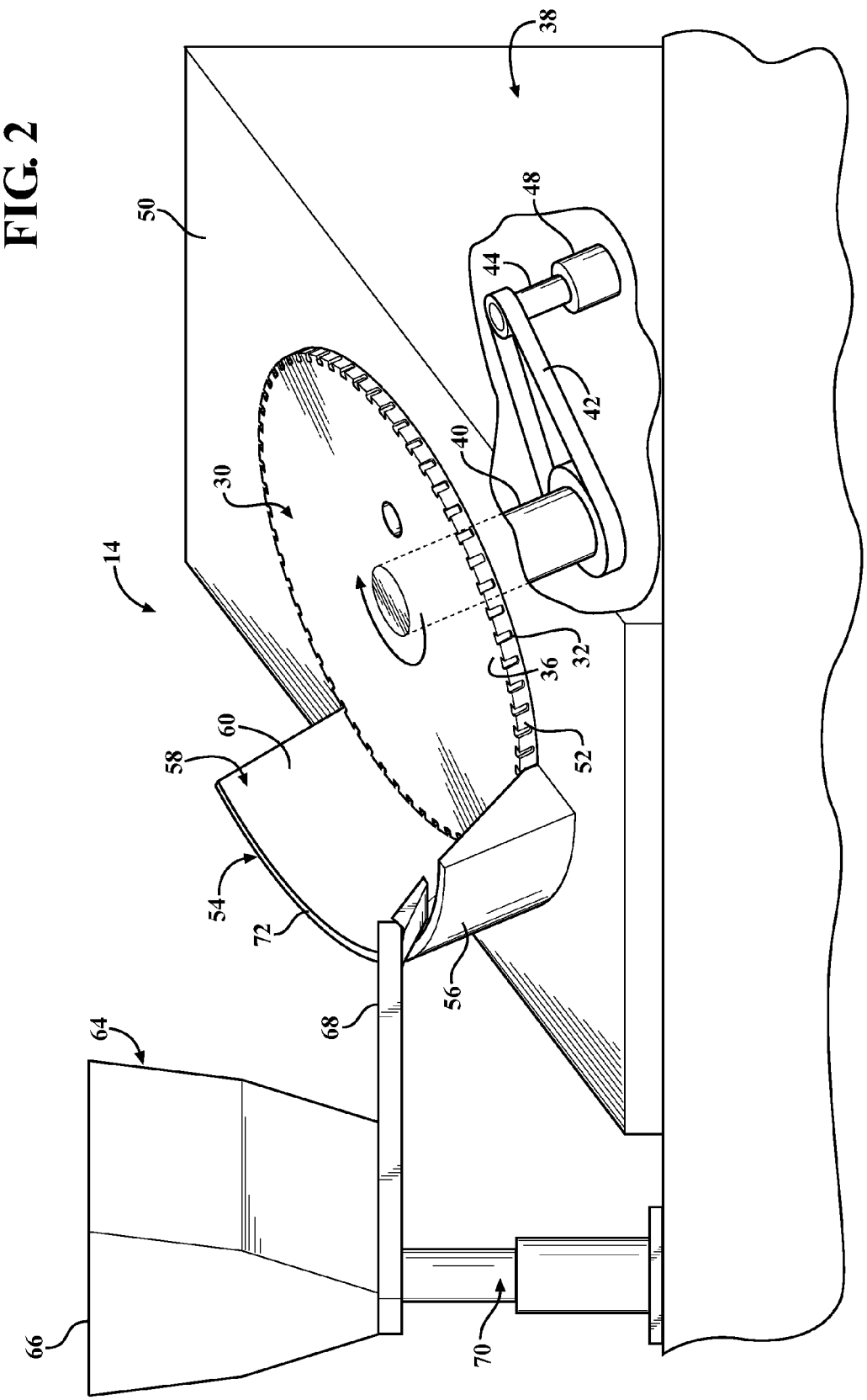
FIG. 2 is a perspective view of one embodiment of a rotary loader of the automated test system of FIG. 1.
Figure 3:
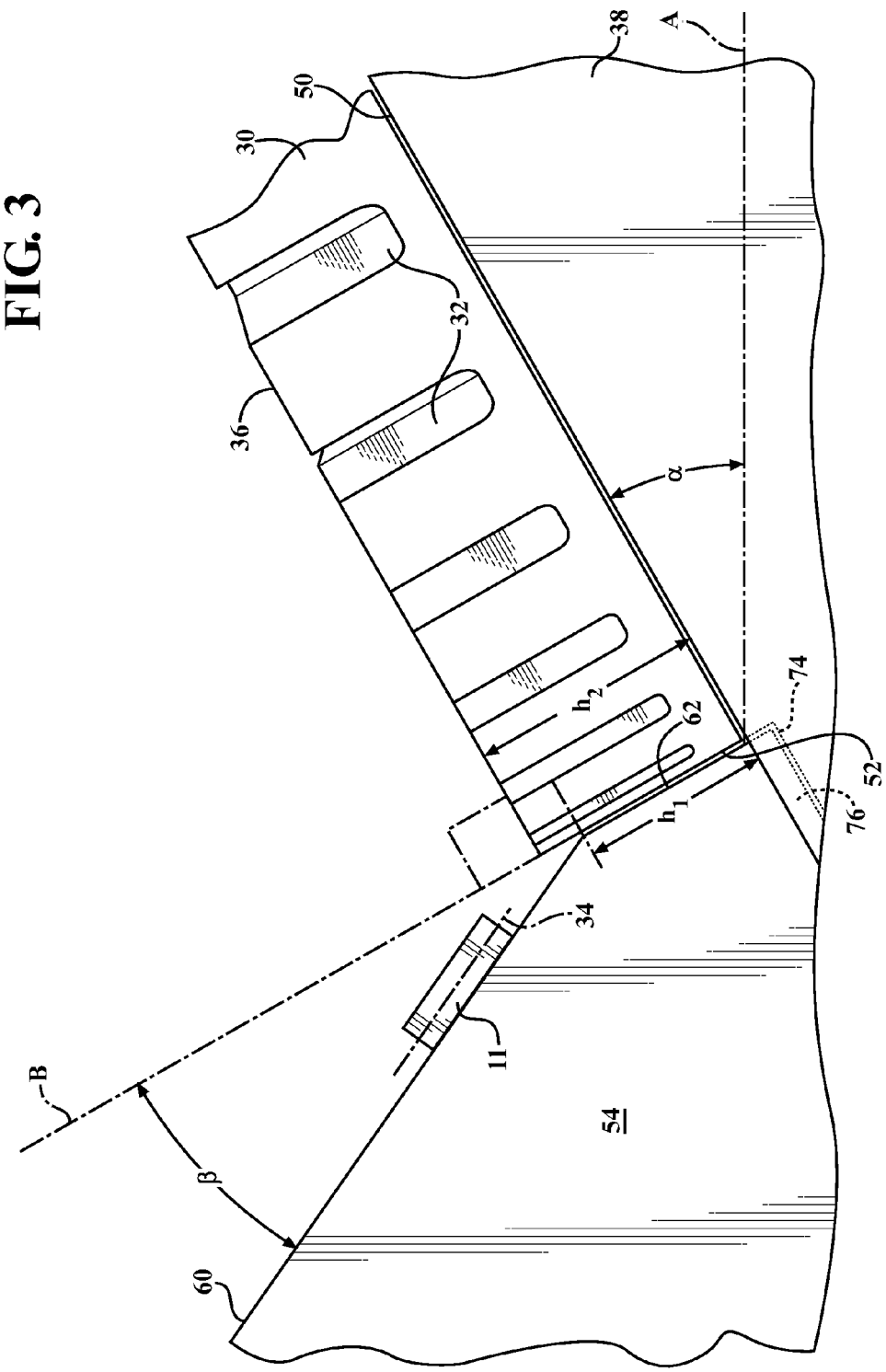
FIG. 3 is a close up view of a portion of the rotary loader of FIG. 2.

Device loader 14 is a rotary loader. That is, essentially it comprises a load plate 30 that rotates in order to capture electronic components or devices 11 within component pockets 32. Further rotation of load plate 30 later brings the component pockets 32 to where devices 11 are transferred to carrier 15. There are two types of component loading that can be associated with a rotary loader. First, vertical loading occurs where component-holding pockets in a load plate orient components such that their long axis is perpendicular to the top surface of the load plate. In essence, the components are standing vertically with respect to the load plate. Vertical loading is particularly needed where the component has a shape without a distinguishable flat side. Flat loading generally refers to a load plate having shallow component pockets on the top surface of the load plate instead of the edge. The component is lying "flat," with body parallel to the top of the load plate. In FIGS. 2 and 3, load plate 30 has component pockets 32 that orient devices 11 with their long axes 34 perpendicular to top surface 36 of load plate 30. Accordingly, FIGS. 2 and 3 show a vertical rotary loader.

Vertical rotary loaders typically have a load plate placed at an inclined angle of 45 to 60 degrees from horizontal. A facing surface is perpendicular to the inclined angle to allow efficient loading.

In contrast to this is device loader 14 described herein. Load plate 30 is mounted for rotary movement on the surface of a wedge 38. Specifically, load plate 30 is removably mounted to a rotatable shaft 40 supported within wedge 38 according to any number of conventional techniques. Rotatable shaft 40 can be rotated by conventional means. For example, as shown by schematically in FIG. 2 due to the wide variety of design options, rotatable shaft 40 is coupled to a belt 42, which is in turn coupled to an output shaft 44 of a motor 48. Preferably but not necessarily the components for moving rotatable shaft 40, here belt 42, output shaft 44 and motor 48 by example, are supported within an interior space of wedge 38. However, some of or all of the means for rotating rotatable shaft 40 can be supported elsewhere. Upon operation motor 48, output shaft 44 rotates, moving belt 42. Belt 42, in turn, moves rotatable shaft 40. In this embodiment, rotatable shaft 40 rotates load plate 30 in a clockwise direction as shown by the arrow in FIG. 2.

Load plate 30 as shown is circular in shape as it offers the simplest "endless" processing and hardware design, but other generally rounded shapes are possible based on the teachings herein. Removing the center of a load plate to form a plate shape more particularly described as annular is typically but not necessarily used when a very larger plate diameter is needed and unstable plate materials must be used. Removing the center is a way to relieve internal stresses and reduce the chance or degree of warpage of the plate. In such a case, a diameter of shaft 40 or its end would be made relatively large to correspond to the larger hole in the center of the plate. In this example, load plate 30 has a relatively small diameter at 200 mm, so warpage is not an issue.

Because a wide variety of configurations of load plate 30 may facilitate removal of devices from component pockets 32, such details are not shown in load plate 30. One such configuration includes, for example, openings in the bottom of component pockets 32 that align with openings in wedge 38 as load plate 30 rotates so that electronic devices 11 supported within pockets 32 will fall into a series of passages of transfer station 18 for mounting in carrier 15.

Wedge 38 is inclined with respect to the horizontal defined by line A shown in FIG. 3. Since it is inclined, angle α is greater than 0 degrees. Here, wedge 38 is inclined at an angle α of less than 45 degrees. Since load plate 30 is arranged in parallel with a top surface 50 of wedge 38, load plate 30 is also inclined from horizontal line A at an angle of inclination α of less than 45 degrees. In the example shown, angle of inclination α is about 30 degrees, but it could range between about 20 and 35 degrees. More preferably, angle of inclination α is between about 25 to 30 degrees. Load plate 30 is generally but not necessarily made of a lightweight, non-conductive material such as a plastic.

A load wall 54 is located about a portion of a lower peripheral edge 52 of load plate 30. More specifically, load wall 54 is semi-circular and extends about the lowest point of lower peripheral edge 52. Load wall 54 could extend evenly about the lowest point of lower peripheral edge 52, but preferably it extends further along lower peripheral edge 52 of load plate 30 in the direction of rotation of load plate 30 than it does in the opposite direction. The reason for this is discussed hereinafter.

Load wall 54 is wedge-shaped and includes a semi-circular outer wall 56 and a semi-circular inner wall 58. Device loader 14 includes a hopper 64 with a large input mouth 66 into which quantities of devices 11 are fed. Although not shown for simplicity, hopper 64 can be coupled to a shaker that imparts vibration so as to move devices 11 through openings in its bottom surface into a chute 68 that directs devices 11 towards inner wall 58 of load wall 54. As shown, hopper 64 is mounted on a rotatable support 70 for rotation towards and away from load plate 30 and load wall 54 so that these components can be replaced without interference from hopper 64. Hopper 64 is arranged in FIG. 2 such that devices 11 are fed over a top edge 72 of load wall 54. While this is a possible arrangement, and is shown this way herein so as not to obscure details of load plate 30 and wedge 38, it is not preferred. More preferably, hopper 64 is mounted on a movable, extendable arm above load plate 30 with the open end of chute 68 facing inner wall 58. Any number of methods can be used to load devices 11 against load wall 58. Further details of one example of a hopper 64 that could be used with the present invention is shown in U.S. Pat. No. 5,842,579, dated Dec. 1, 1998 and assigned to Electro Scientific Industries, Inc. of Portland, Oreg.

Semi-circular inner wall 58 has a loading surface 60 and a retention surface 62. Retention surface 62 is in parallel to with the outer edge of load plate 30. Specifically, retention surface 62 is in parallel with outer edge 52. This means that retention surface 62 is arranged at a right angle (i.e., is perpendicular) with respect to load plate 30 as shown in FIG. 3. Loading surface 60 is arranged an angle β inclined from perpendicular line B formed by outer edge 52 of load plate 30 with respect to upper or top surface 36 of load plate 30. Loading surface 60 is also called "tilted back" with respect to retention surface 62. Angle of inclination β at which loading surface 60 is tilted back should be sufficiently large such that loading surface 60 is flat enough relative to horizontal line A to allow the majority of devices 11 to lie against loading surface 60 instead of upper surface 36 of load plate 30. On the other hand, if angle of inclination β is too large, devices 11 will not have sufficient gravity to overcome inertia and slide down loading surface 60 upon being dispensed by hopper 64. In the example shown, angle of inclination β of loading surface 60 is 25 degrees. However, loading surface 60 can be tilted back at an angle of between about 20 to 30 degrees and achieve efficient loading of device 11 shown (that is, device 11 having a long axis 34 and a relatively flat profile). The actual angle β depends upon the size and shape of devices 11 and the type of load plate 30 as discussed hereinafter. The goal is to select an angle of inclination β that results in loading surface 60 that is sufficiently flat with respect to the horizontal and also sufficiently parallel to the angle of component pockets 32 in load plate 30 so that efficient loading results. Efficient loading mean a relatively high load rate with minimal damage to devices 11. In any event, angle of inclination β should be less than about 50 degrees. Preferably, angle of inclination β is less than 45 degrees, and more preferably, angle of inclination β is less than 35 degrees.

The length (also called height herein) of retention surface 62 is generally the same as the length (or height) of peripheral edge 52 of load plate 30. However, retention surface 62 can be made longer or shorter. In FIG. 3, for example, a height h1 of retention surface 62 above top surface 50 of wedge 38 is less that a height h2 of upper surface 36 of load plate 30 above top surface 50 of wedge 38. With component pockets 32 located within outer edge 52 of load plate 30, the shorter height h1 of FIG. 3 serves to aid loading efficiency by increasing the clearance at upper surface 36 of load plate 30. A retention surface 62 where height h1 is longer than h2 has not shown significant change in performance. The length of loading surface 60 is not particularly important as long as it provides sufficient supporting space for a number of devices 11 grouped close to outer edge 62 of load plate 30 that are awaiting loading into component pockets 32.

In the arrangement shown, load plate 30 is not confined to a relatively steep angle from horizontal line A and load wall 54 is not confined to match the angle of the edge of load plate 30 while still allowing efficient loading. For these reasons, particularly the new shallow angle of load plate 30, device loader 14 can also be used for loading components in "flat" orientation, that is, in an orientation where the component body is generally parallel to upper surface 36 of load plate 30 when loaded. To affect such a change, load plate 30 is removed from its coupling to rotatable shaft 40. Then, a different load plate, such as one with component pockets formed in an upper surface of the new load plate for flat loading, is affixed to rotatable shaft.

After replacement of load plate 30, a new load wall can replace load wall 54 with an arrangement of loading surface 60, retention surface 62 and angle of inclination β that permits efficient loading of the new size and shaped devices 11. To make this change, load wall 54 must be removably affixed to wedge 38. There are many ways to do this including clamps, clips, detent arrangements, etc. Load wall 54 can be affixed to upper surface 50 of wedge 38. In the example here, load wall 54 is mounted within a depression 74 cut out of upper surface 50 shaped in conformance with the outer contours of load wall 54. This means that a portion 76 of load wall 54 is located below upper surface 50. Preferably, wedge 38 is made out of the same or a stiffer material than load wall 54, and depression 74 is sized so that portion 76 of load wall 54 is securely fit by pressing engagement of load wall 54 into depression 74. Then, load wall 54 can be removed merely by lifting it from depression 74. Another option in this arrangement is to have detents along the outer peripheral edge of depression 74 in mating relation with detents along the outer peripheral edge of portion 76

In addition to changing load wall 54 for flat loading, load wall 54 can be changed for efficiency without making any other equipment changes. That is, for example, even if the same load plate is used, a different load wall can be used if differently-sized devices 11 are to be loaded and tested. The load wall surface, including loading surface 60 and retention surface 62, is distinguished from all other functions and can be manipulated independently to affect a change in loading efficiency. This is particularly desirable with LEDs as the packages currently range from 2 mm to 10 mm in size. Moreover, this can effect a significant reduction in changeover time for different devices 11 since the only changes to loaders 14, 16 would be load wall 54 and optionally load plate 30. A change in wedge 58 and other components supporting load plate 30 would not be needed.

Load wall 54 preferably comprises a lightweight, non-conductive material such a plastic material, but this is not necessary.

In operation, electronic devices 11 are loaded into the device loaders 14, 16, where they are singulated. Following singulation, the devices are transferred from device loaders 14, 16 to conveyor 12 at a transfer station 18. Transfer station 18 is configured to move electronic devices 11 individually from device loaders 14, 16 to carriers 15 using mechanical or pneumatic means.

Conveyor 12 indexes, or moves a predetermined amount, which moves electronic devices 11 sequentially into proximity with first test station 20 and second test station 22. Conveyor 12 is configured to support and move carriers 15 in a continuous circuit and may be formed in any suitable geometry with any suitable engagement mechanisms. For example, conveyor 12 could include spaced apart first and second rails with top surfaces supporting carrier 15 and a plurality of cleats engaged with carrier 15 and a belt, chain or cable whose position is indexed under the influence of a motor (not shown) or other suitable means. Accordingly, movement of the belt, chain or cable would move the cleats and hence any connected carriers 15 along the path of conveyor 12.

First and second test stations 20, 22 may be configured to measure electronic devices 11 for parameters such as leakage current, forward operating voltage, output voltage, electrical current draw, etc. An exemplary device that can perform these functions is the Model 616 Test and Measurement Source, manufactured by Electro Scientific Industries, Inc. of Portland, Oreg. In addition, if electronic devices 11 are LEDs, they may also be measured for light output parameters such as luminous flux and spectral light output. This could be done, for example, using a spectrophotometer and an integrating sphere.

Following testing, electronic devices 11 are unloaded at an unloading station 25. Unloading station 25 can be configured to sort electronic devices 11 based on the results of the tests using a bin assembly 24 and an ejection assembly 26. Bin assembly 24 includes a large number of bins, and ejection assembly 26 ejects each electronic device 11 individually into a selected one of the bins of bin assembly 24 using, for example, selective application of pressurized air.

A typical cycle time for test system 10 contemplates a throughput of 32,000 devices per hour, which allows for a cycle time of 225 ms per device for each step in the process. In a typical system, conveyor 12 could be configured to index from one position to the next in 100 ms, leaving 125 ms for each step.

Using device loaders 14, 16 as described in detail herein desirably provides one loader that is capable of both vertical and flat loading without the need for major changes such as altering a load plate's angle from horizontal. The option for vertical or flat loading is particularly advantageous for LED packages, which have varied geometry with varied resulting loading efficiencies depending on the loading method.

Additionally, use of a shallow inclined angle for a load plate is desirable for delicate parts such as ceramic body LEDs. The decreased angle reduces the gravitational force on the components, reducing the damaging forces as the LEDs tumble against the surfaces of loaders 14, 16 and against each other during the normal loading process. Steep inclines, in contrast, tend to pile up components.

While the invention has been described in connection with certain embodiments, it is to be understood that the invention is not to be limited to the disclosed embodiments but, on the contrary, is intended to cover various modifications and equivalent arrangements included within the scope of the appended claims, which scope is to be accorded the broadest interpretation so as to encompass all such modifications and equivalent structures as is permitted under the law.

What is claimed is:

1. A rotary loader, comprising:
   a rotatable load plate including a plurality of component pockets arranged about a rotational axis of the load plate, the load plate inclined with respect to a horizontal surface at an angle of inclination of less than 50 degrees; and
   a load wall arranged about a lower portion of the load plate adjacent certain ones of the plurality of component pockets and extending above a height of the load plate, the load wall including a retention surface extending in a direction parallel to an outer peripheral edge of the load plate and a loading surface inclined with respect to a line perpendicular to a top surface of the load plate in a direction away from the retention surface at an angle of inclination of less than 45 degrees;
   wherein the retention surface extends to a height less than or equal to a height of the top surface of the load plate above an inclined surface on which the load plate is mounted.

2. The rotary loader of claim 1 wherein the load plate is rotatable in a clockwise direction.

3. The rotary loader of claim 2 wherein the load wall extends further along the lower portion of the load plate in the clockwise direction from a lowest point of an outer peripheral edge of the load plate than it extends along the lower portion of the load plate in a counter-clockwise direction from the lowest point.

4. The rotary loader of claim 1 wherein the angle of inclination of the load plate is 30 degrees.

5. The rotary loader of claim 4 wherein the angle of inclination of the loading surface is 25 degrees.

6. The rotary loader of claim 1, further comprising:
   a wedge forming a mounting surface for the load plate, the wedge inclined at the angle of inclination of the load wall.

7. The rotary loader of claim 6 wherein the load wall is removably engaged with the wedge.

8. The rotary loader of claim 1 wherein the load wall is removably engaged with a mounting surface of the load plate.

9. The rotary loader of claim 8 wherein the mounting surface comprises a depression having a same shape as outer contours of a bottom surface of the load wall; and wherein the load wall is removably engaged with the depression.

10. The rotary loader of claim 1 wherein the plurality of component pockets are located in the outer peripheral edge of the load plate.

11. The rotary loader of claim 1 wherein an outer peripheral surface of the load wall is semi-circular and the retention surface is semi-circular.

12. The rotary loader of claim 11 wherein the retention surface faces the certain ones of the plurality of component pockets.

13. The rotary loader of claim 1 wherein the loading surface extends from the retention surface to a top surface of the load wall at the angle of inclination, the rotary loader further comprising:
   a hopper arranged with a chute extending over the top surface of the load wall to drop electronic components on the loading surface.

14. The rotary loader of claim 1 wherein the plurality of component pockets form openings in the outer peripheral edge of the load plate.

* * * * *